United States Patent
Lee et al.

(10) Patent No.: US 7,109,532 B1
(45) Date of Patent: Sep. 19, 2006

(54) HIGH ION/IOFF SOI MOSFET USING BODY VOLTAGE CONTROL

(76) Inventors: Zachary K. Lee, 20430 Via Paviso, E38, Cupertino, CA (US) 95014; Farid Nemati, 350 Sharon Park Dr., #A23, Menlo Park, CA (US) 94025; Scott Robins, 6678 Charter Oak Pl., San Jose, CA (US) 95120

( * ) Notice: Subject to any disclaimer, the term of this patent is extended or adjusted under 35 U.S.C. 154(b) by 42 days.

(21) Appl. No.: 10/746,758

(22) Filed: Dec. 23, 2003

(51) Int. Cl.
*H01L 29/74* (2006.01)
*H01L 27/12* (2006.01)

(52) U.S. Cl. .................. 257/133; 257/348; 257/350
(58) Field of Classification Search ............... 257/107, 257/133, 347–351
See application file for complete search history.

(56) References Cited

U.S. PATENT DOCUMENTS

| | | | |
|---|---|---|---|
| 5,559,368 A | 9/1996 | Hu et al. | |
| 5,780,899 A | 7/1998 | Hu et al. | |
| 5,943,258 A * | 8/1999 | Houston et al. | 365/165 |
| 6,229,161 B1 | 5/2001 | Nemati et al. | |
| 6,399,989 B1 * | 6/2002 | Dockerty et al. | 257/347 |
| 6,462,359 B1 | 10/2002 | Nemati et al. | |
| 6,825,524 B1 * | 11/2004 | Ikehashi et al. | 257/314 |
| 6,835,982 B1 * | 12/2004 | Hogyoku | 257/347 |
| 6,845,034 B1 * | 1/2005 | Bhattacharyya | 365/149 |
| 6,873,539 B1 * | 3/2005 | Fazan et al. | 365/149 |
| 2004/0014304 A1 * | 1/2004 | Bhattacharyya | 438/570 |
| 2004/0029370 A1 * | 2/2004 | Prall | 438/570 |
| 2005/0001232 A1 * | 1/2005 | Bhattacharyya | 257/133 |

OTHER PUBLICATIONS

Yuuichi Hirano, et al., "Impact of Actively Body-Bias Controlled (ABC) SOI SRAM by Using Direct Body Contact Technology for Low-Voltage Application," IEDM 2003 Technical Digest, pp. 35-38.
Fariborz Assaderaghi, et al., "Dynamic Threshold-Voltage MOSFET (DTMOS) for Ultra-Low Voltage VLSI," IEEE Transaction on Electron Devices, vol. 44, No. 3, Mar. 1997, pp. 414-422.

* cited by examiner

*Primary Examiner*—T. N. Quach
(74) *Attorney, Agent, or Firm*—Fields IP, PS (57) ABSTRACT

A semiconductor device may comprise a partially-depleted SOI MOSFET having a floating body region disposed between a source and drain. The floating body region may be driven to receive injected carriers for adjusting its potential during operation of the MOSFET. In a particular case, the MOSFET may comprise another region of semiconductor material in contiguous relationship with a drain/source region of the MOSFET and on a side thereof opposite to the body region. This additional region may be formed with a conductivity of type opposite the drain/source, and may establish an effective bipolar device per the body, the drain/source and the additional region. The geometries and doping thereof may be designed to establish a transport gain of magnitude sufficient to assist the injection of carriers into the floating body region, yet small enough to guard against inter-latching with the MOSFET.

14 Claims, 5 Drawing Sheets

HIGH ION/IOFF SOI MOSFET USING BODY VOLTAGE CONTROL

BACKGROUND

The present disclosure is related to a semiconductor device and, more particularly, to a partially-depleted silicon-on-insulator (SOI) MOSFET.

Manufactures of semiconductor devices continually strive for integrated circuits of higher density and devices of smaller dimensions in order to improve cost efficiencies and performance. However, these scaling efforts have resulted in some undesirable effects in leakage current, e.g., the off-state leakage current (Ioff) of a MOSFET.

Excess leakage current (Ioff) in these MOSFETs may result in high power consumption for devices of large-scale integrated circuits, such as memory, processors, controllers, communication and networking circuits, etc. The high power consumption, in turn, can adversely affect requirements for heat dissipation. Additionally, in the case of some hand-held products, the integrated circuits with excess leakage may reduce the operating-time that may be available within a given fixed-energy battery life. Accordingly, there may be a demand for low-leakage MOSFETs.

Of the bulk and silicon-on-insulator MOSFET, the SOI MOSFET can offer lower parasitic junction capacitance and superior sub-threshold voltage swing. Such benefits may assist high-speed, current drive applications.

In general, SOI MOSFETs can be characterized into two different categories: fully-depleted and partially-depleted SOI MOSFETS. Fully-depleted SOI (FD-SOI) MOSFETs conventionally comprise a very thin body region, which may be fully depleted of majority carries under the influence of a standard gate bias. Partially-depleted SOI (PD-SOI) MOSFETs, on the other hand, may have a thicker body that may not be fully depleted during normal gate bias. This remaining portion that is not depleted may be described as a "floating body" region. Typically, the partially-depleted versus fully depleted SOI MOSFET are more commonly used in integrated circuit designs, which may be due to a variety of considerations such as density constraints and their greater ease of manufacturing.

SUMMARY

For some embodiments of the present invention, charge may be injected into a floating body of a partially-depleted SOI MOSFET during device operation. The charge may accumulate in the floating body to establish a voltage build-up that may influence an overall performance of the MOSFET. In other words, the floating body may "float" to an increased voltage magnitude based on the amount of accumulated injected charge. This attributed may be tailored for a desired performance.

The floating-body partially-depleted SOI MOSFET provides a number of features that may benefit a variety of different circuits. In one embodiment, a dynamic-kink effect—i.e., wherein the body-to-source voltage may increase in an N-channel device (and decrease in a P-channel device) as a result of a gate-to-body coupling—can help decrease the magnitude of a threshold voltage (|Vt|) for assisting drive current capability. This in turn can be used to reduce propagation delays for inverter applications. In another embodiment, a drain-to-body coupling can provide a dynamic-loading effect to decrease the body-to-source voltage for an N-channel device and increase the body-to-source voltage for a P-channel device, thereby effective to increase |Vt| and reduce the load (gate capacitance) of a given MOSFET. This might also be used to reduce propagation delays.

In accordance with another embodiment of the present invention, a partially-depleted SOI MOSFET may comprise source and drain regions over an insulator and a body region therebetween. The floating body region may receive injected carriers from an adjacent region of semiconductor material during its operation.

In another embodiment, the floating body region of a partially-depleted SOI MOSFET may receive a voltage. The voltage may be controlled to adjust the performance of the MOSFET device dependent on a particular application. For example, the voltage for the floating body region may be adjusted to establish a desired voltage threshold magnitude (|Vt|) for the MOFET dependent on its desired use, such as, e.g., for isolation, current drive, transparency, propagation characteristics, impedance, etc.

In another embodiment, a semiconductor device may comprise a memory cell and an SOI MOSFET to access the memory cell. The MOSFET may comprise a body between a source and drain. An additional region of semiconductor material may be disposed in contiguous relationship with a drain/source region of the MOSFET and may be formed with a conductivity of type opposite the drain/source. The body, drain/source and the additional region of semiconductor material may thus be described an inherent bipolar transistor.

In a further embodiment, at least one of the parameters of the bipolar device—e.g., the drain/source implant dose, its implant energy, the drain width, a thickness of a silicide over the drain, the placement of another silicide over the additional semiconductor region, a lifetime control implant, a halo implant or the gate electrode placement—may be structured to establish a gain for the inherent bipolar device of a magnitude sufficient to enable carrier injection into the floating body, yet small enough to prevent MOSFET inter-latching.

BRIEF DESCRIPTION OF DRAWINGS

Subject matter of embodiments of the present invention and methods of operation may be further understood by reference to the following detailed description when read with reference to the accompanying drawings, in which.

DESCRIPTION

In the following description, numerous specific details are set forth to provide an understanding of exemplary embodiments of the present invention, wherein similar elements between the various embodiments may be annotated similarly.

Additionally, readily established circuits or elements of the exemplary embodiments may be disclosed in simplified form (e.g., simplified block diagrams and/or simplified description) to avoid obscuring an understanding the embodiments with excess detail. Likewise, to aid a clear and precise disclosure, description of known structures—e.g., sidewall spacers, gate oxides, hallo regions, conductive lines, contacts, vias, etc.—may similarly be simplified where persons of ordinary skill in this art can readily understand such structures and provisions by way of the drawings and present disclosure.

As used herein, "substrate" or substrate assembly may be meant to include, e.g., a portion of a semiconductor wafer. Such portion may have one or more layers of material that have been formed on or within the substrate. These layers and/or additional layers formed thereon, may be patterned and/or may comprise dopants to produce devices (e.g., transistors, diodes, capacitors, interconnects, etc.) for an integration of circuitry. In forming these devices, one or more of the layers may comprise or result in topographies of various heights. When referencing this integration of circuitry, it may be described as integrated together, or on or with the substrate.

Furthermore, those skilled in the art will recognize that although an example of the present invention may describe fabrication of an N-type MOS transistor, the dopant type(s) of the substrate in addition to the doped regions thereof may be reversed to form a P-type MOS device. And, in accordance with further embodiments, both N-type and P-type devices could be formed on a common substrate.

As used hereinafter, "floating" may be used to characterize the relationship of a particular portion of a body to a MOSFET relative to other portions thereof. The descriptor "floating", in one sense, may characterize the relationship of the body relative to an underlying bulk substrate. It may also characterize a voltage potential thereof that may be "floating" separately relative to other regions of the MOSFET. Therefore, in accordance with particular embodiments disclosed herein, the floating body might obtain an electrical potential that may be different from the potential of a channel region of the MOSFET.

In exemplary embodiments of the present invention, a source/drain region of a partially-depleted SOI MOSFET may propagate charge across the source/drain to influence the bias of the non-depleted region. Despite such influx of charge thereto, the non-depleted region may still to be described as a floating body.

As referenced herein, portions of a transistor may be described as formed in, at or on a semiconductor substrate. Such alternative terms on/in/at may be used individually merely for purposes of convenience. In the context of forming semiconductor devices, such terms may collectively reference portions of a semiconductor element that may be within and/or on a starting material. For example, with reference to device 100 of FIG. 1A, a silicon-on-insulator (SOI) metal-oxide-semiconductor field-effect transistor (MOSFET) may comprise source 102 and drain 104 regions within semiconductor layer 106. Body region 105 may be disposed between the source and drain regions. Gate 112 (e.g., conductive material over a gate oxide (not shown)) may be disposed on the upper surface of semiconductor layer 106 and over surface 109 of body 105. Thus, the description of device 100 at a region of a semiconductor substrate may be understood, dependent upon its relative context, to comprise, e.g., source, body and drain regions within semiconductor layer 106 over insulator layer 108 and over bulk substrate 110.

Figure 1A:
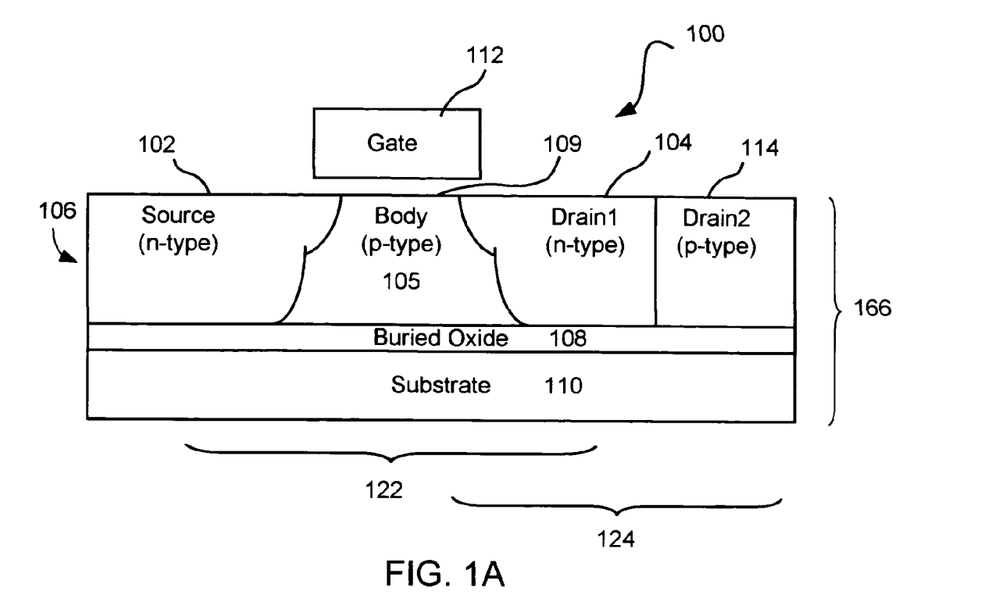
FIG. 1A is a simplistic cross-section view of a semiconductor device illustrating a partially-depleted, SOI MOSFET according to an embodiment of the present invention.

Referencing FIG. 1A, in accordance with an embodiment of the present invention, a MOSFET 100 may be formed in a layer of semiconductor material 106 disposed over an insulator, e.g., buried oxide 108 on supporting substrate 110. In a particular example, the semiconductor material may comprise silicon of, e.g., P-type dopant. N-type dopant may be implanted into select regions of the layer of semiconductor material may define the source and drain regions about body region 105.

Figure 2A:
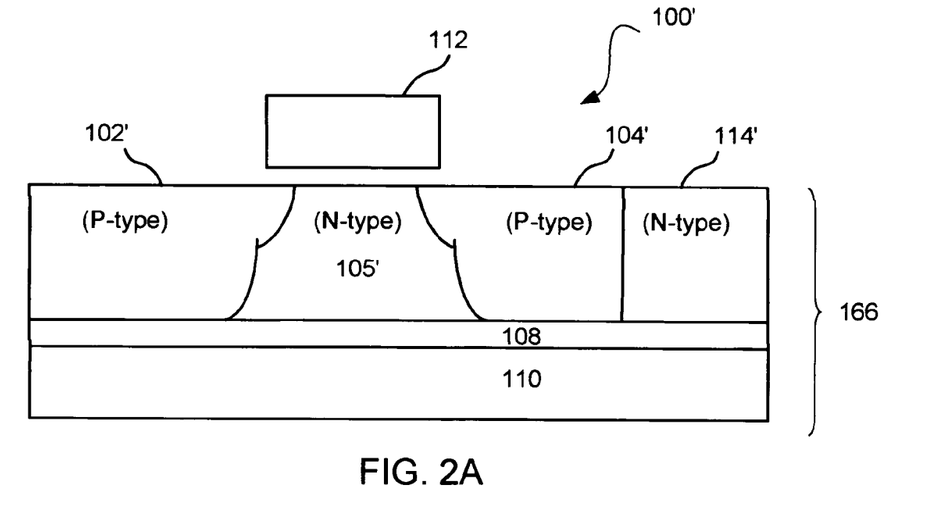
FIG. 2A is a simplistic cross-section view of a portion of a semiconductor device showing a partially-depleted, SOI MOSFET according to a further embodiment of the present invention and of polarity opposite to that of FIG. 1A.

In operation, a positive potential may be applied to the gate 112 to establish an electric field within body region 105. This, in turn, may attract and accommodate minority carriers of the body to the surface region of the body beneath the gate. The accumulation may form a conductive inversion channel (N-channel) between the source and drain regions. Conversely, relative to FIG. 2A, a P-channel MOSFET 100' might receive a negative voltage for biasing its gate to effect a P-channel within an N-type body between its source and drain regions. For the following discussion, an N-MOSFET and appropriate biases therefore may be used for description of various embodiments; it will be understood, however, that the same principles may also apply to a P-MOSFET, in which the roles of electrons and holes are interchanged, and positive biases replaced by negative biases.

Figure 1B:
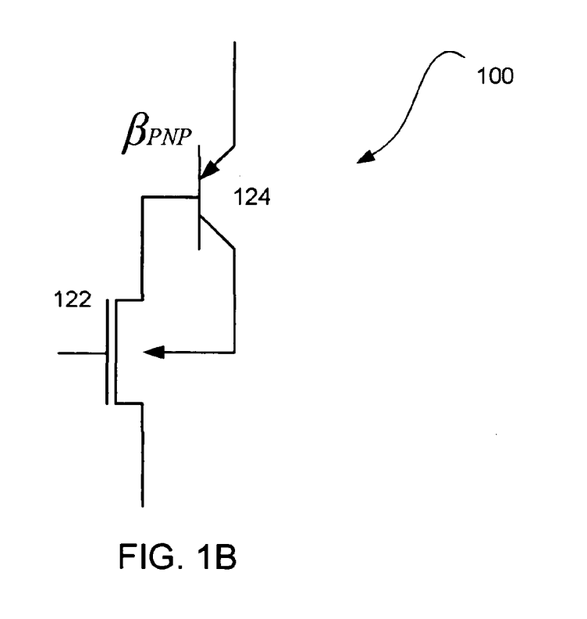
FIG. 1B is a schematic representation of the device of FIG. 1A.
Figure 2B:
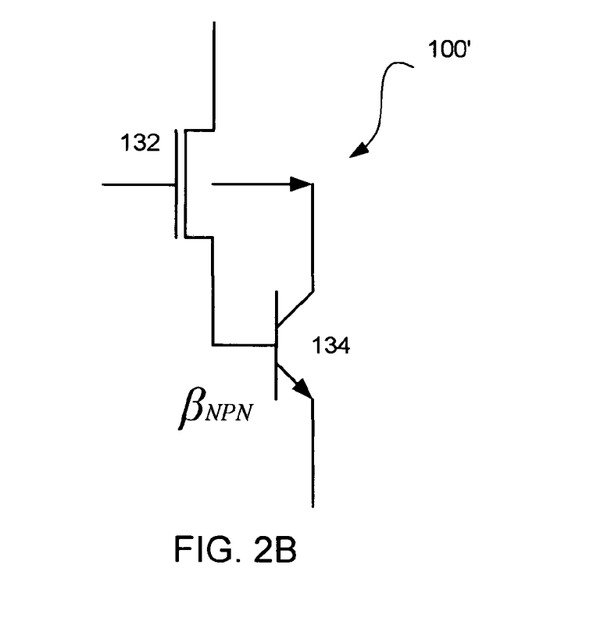
FIG. 2B is a schematic representation of the device of FIG. 2A.

Further referencing FIG. 1A, the partially-depleted SOI MOSFET 100 may further comprise another doped region 114 (drain2) formed in contiguous relationship with drain 104 (drain1). The extra region may contact drain region 104 on a side thereof opposite to body region 105. With the drain 104 disposed electrically in series between body 105 and the additional region 114, the collection together may be viewed as an inherent bipolar device. For an NMOS of N-type source, P-type body and N-type drain regions, an additional region of P-type material may be formed against one of the drain/source N-regions. The resulting device may be deemed a hybrid combination of a MOSFET 122 (source, body, drain1) and an inherent bipolar transistor 124 (see FIG. 1B). The body 105, drain1 104 and drain2 114 may be alternatively described as collector, base and emitter respectively of the bipolar device. In the case of an NMOS 122 (of a N-type source, P-type body and N-type drain) the additional region 114 of P-type conductivity may serve as an emitter region of a PNP bipolar device 124. Conversely, referencing FIGS. 2A–2B, for a PMOS device 132, the extra dopant region 114' of N-type conductivity may establish emitter 114' to an NPN bipolar device 134.

Figure 3:
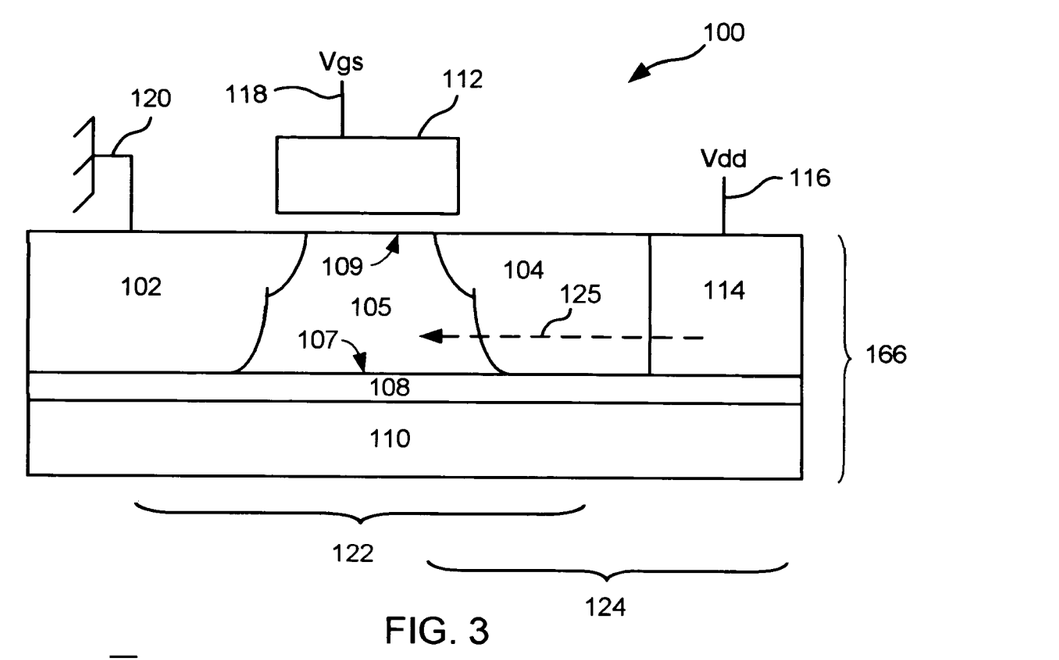
FIG. 3 is a cross-section view similar to FIG. 1, further illustrating electrical couplings and a current flow as may be used for describing a method of operating a partially-depleted SOI MOSFET according to an embodiment of the present invention.

In operation, referencing FIG. 3 and in accordance with a particular embodiment, a positive bias Vdd may be coupled through a conductive line 116 to the extra dopant region 114 (e.g., drain2 of P-type conductivity). Minority carriers (holes) may be injected into the drain region 104 (drain1 of N-type conductivity). Traversing the drain region 104, these carriers 125 may then enter body region 105 of the MOSFET 122. Accordingly, the floating body of the MOSFET 122 may accumulate residual charge and build-up a potential with respect to the source 102. In this particular example, the source may be coupled through a conductive line 120 to a ground potential. With sufficient charge injection, the floating body may obtain a voltage level that may effectively decrease the transistor's threshold voltage Vt, which may enhance the resulting drive current. Although the extra dopant region 114 is illustrated in this explanation as being coupled to Vdd; it will be understood that alternative embodiments may bias or couple this region to a alternative node, supply, integrated member, conductor, or contact. Similarly, source region 102 could be configured for a bias voltage other than ground.

Figure 4:
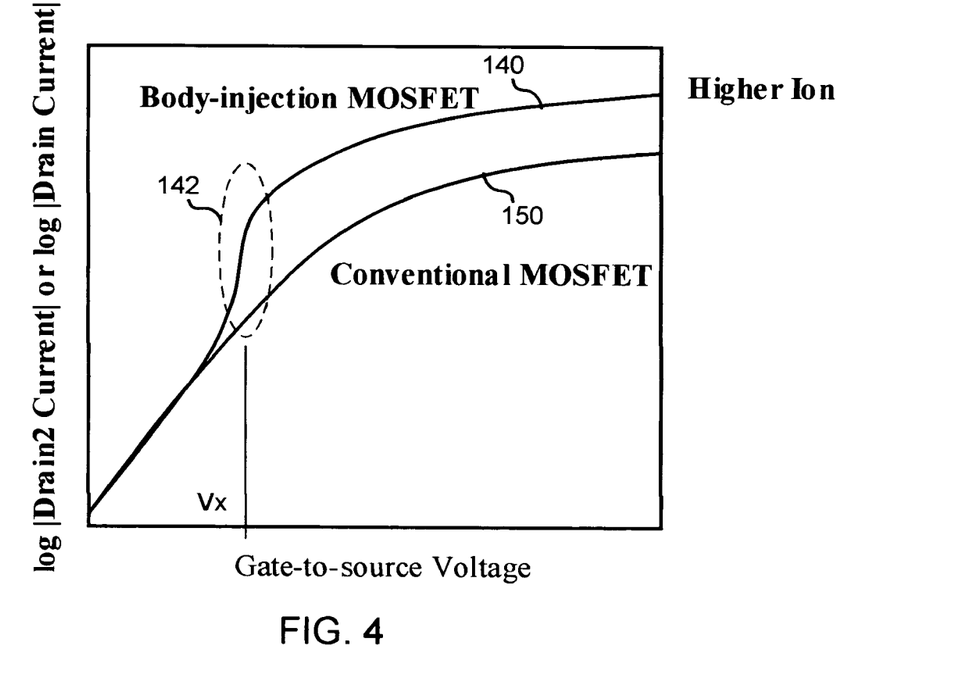
FIG. 4 is graph illustrating properties of a partially-depleted, SOI MOSFET for an exemplary embodiment of the present invention.

Referencing FIG. 4, the current (I) versus voltage (Vgs) characteristics 140 for a carrier injection enhanced (body-injection) MOSFET may be compared relative to the I-V characteristics 150 for a typical MOSFET. One performance parameter that may be taken from this curve is the subthreshold swing, which may be defined by an amount of gate voltage increase required to produce a decade change in drain current. For particular embodiments disclosed herein, this subthreshold swing for the carrier injection enhanced MOSFET may be substantially reduced, which may be due to an ever-increasing level of carrier injection into the floating body for enhancing its voltage magnitude as the gate voltage ramps upwardly. Such property for reduced subthreshold swing may enable the formation of circuits with enhanced switching sensitivity; wherein small changes in gate voltage may control switching of the device from an off-state condition of very low leakage (Ioff) to an on-state condition of high drive (Ion).

For a conventional bulk MOSFET, the subthreshold swing presented along curve 150 might be limited to around 75 mV/decade (theoretically, its lowest level would be limited to 60 mV/decade at room temperature). For a partially-depleted SOI MOSFET with the body-injection provisions, a kink effect 142 (caused by injection of carriers 125 at a given bias level Vx) appropriately positioned along the I-V curve by design can effect a low subthreshold swing for toggling between the on-state and off-state conditions. When placed appropriately, the kink can substantially reduce the subthreshold swing and the change in gate-to-source voltage required to control the operation of the MOSFET.

In particular embodiments, the gain (e.g., beta or $\beta_{PNP}$) for the carrier transport and injection by the inherent bipolar device (124 of FIG. 1B) may be used to control the placement of the kink effect 142. As one parameter of the device's many possible influences, an appropriately designed gain for the carrier transport and injection can serve to position the kink operatively along the I-V curve for simplified control and switching between states. For example, with the appropriate carrier transport gain through the drain region for injection into the floating body, a subthreshold swing may be obtained that is substantially less than the 60 mV/decade.

Various solutions may be used to establish the carrier transport gain, and likewise the amount of carrier injection enhancement for placement of the kink effect. Some exemplary embodiments determine or define a gain therefore of a magnitude sufficient to assist the carrier injection into the body region, yet small enough to guard against the inter-latching of the MOSFET. For example, one form of solution may comprise impacting the gain via the amount of dopant provided for the base region over a base integral length relative to the amount of dopant provided for the emitter region over an emitter integral length thereof, wherein a design for a target ratio therebetween may be guided or established by general principals of available Gummel equation relationships and understandings of bipolar transistor theory.

For the base region (drain), its thickness, overall width, and doping profile may each or collectively be designed to, at least in part, establish the desired gain. In one case, silicide 264 may be disposed over a portion of the drain 204 (see FIG. 5), which may have the effect of decreasing the effective thickness of the base region. Additionally, at the boundary between the silicide and silicon semiconductor material (the surface of the silicide), an infinite recombination rate may exist, thereby effectively reducing the overall bipolar gain. During operation, the percentage of holes that might otherwise traverse the base may be reduced as a result of the recombination occurring at the silicide interface.

In another particular embodiment, silicon layer 108 may comprise a thickness, e.g., between 200 and 5,000 angstroms or of about 1,000 angstroms. The dopants implanted therein may have been formed using energy of between 1 keV to 100 keV (for phosphorous) and between 1 keV and 300 keV (for arsenic). This may form a doping profile that may impart gain to the transport of carriers through the base for injection into the floating body. Again, the gain should be sufficient to enable the carrier injection while at the same time being small enough so as to guard against the risk of MOSFET inter-latching.

Figure 5:
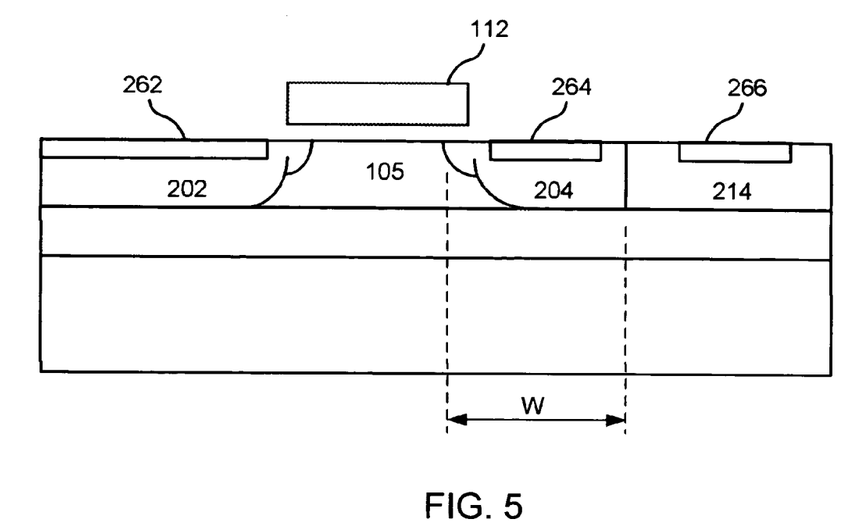
FIG. 5 is a simplistic cross-section view of a portion of a semiconductor device showing a partially-depleted MOSFET according to a further embodiment of the present invention, and showing an exemplary first silicide structure on the drain (drain1) and another optional silicide structure on the additional semiconductor region (drain2) against the drain.

In the emitter region, further referencing FIG. 5, silicide 266 may also be disposed with a given outline over the additional region 214. An offset may be defined between the peripheral edge of the silicide 266 relative to a depletion region for the boundary between the base and emitter 204, 214. This offset may be set to establish an effective emitter integral length, and to define in part (per the Gummel concepts) the desired gain for the bipolar device.

Although the embodiment of FIG. 5 illustrates the silicide structures 264,266 over respective drain1 and drain2 regions; alternative embodiments may comprise just one of the silicide regions.

In accordance with a further embodiment, lifetime adjustment species may be implanted into at least one of the additional region 214 and/or drain region 204. These lifetime adjustment implants may serve to recombine with a portion of the minority carriers that might otherwise travel across the drain region, so as to affect, at least in part, the desired gain for carrier transport and injection into the floating body region.

Figure 6:
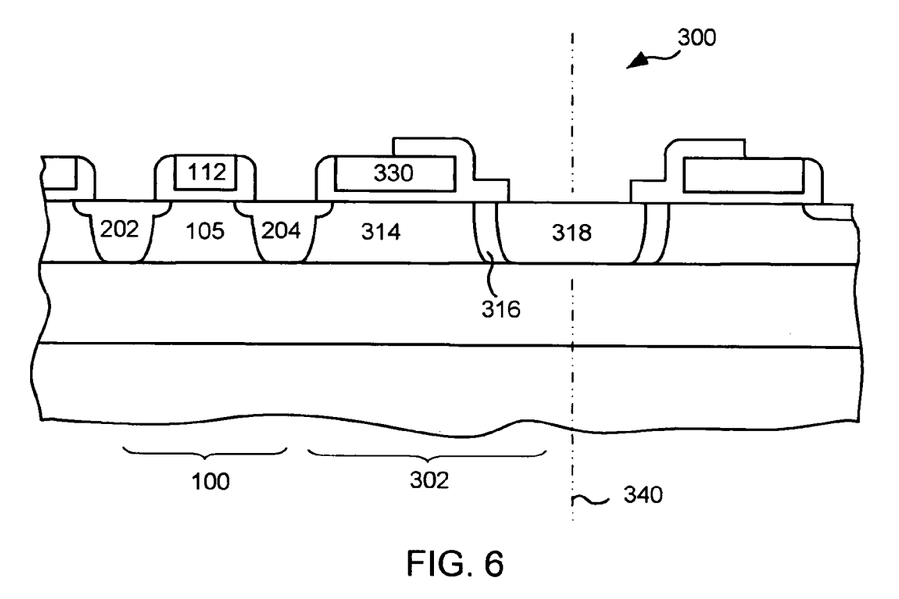
FIG. 6 is a simplistic cross-section view of a portion of a semiconductor device showing a memory cell in accordance with an embodiment of the present invention, and showing a partially-depleted SOI MOSFET coupled in series relationship to a thin-capacitively coupled thyristor.

In another embodiment, referencing FIG. 6, a semiconductor memory 300 may incorporate a body-injection, partially-depleted SOI MOSFET 100 (from an embodiment described above relative to FIGS. 1–5) as an access transistor to access a memory element. In this embodiment, the memory element may comprise a capacitively-coupled thyristor 302. Again, the properties—e.g., the doping, thickness, width, density, and/or silicide treatment, and/or lifetime adjustment implant, etc.—of the emitter region relative to the base region of the inherent bipolar device 324 may be designed to establish an carrier transport gain that may assist injection of carriers into the floating body region. The gain may be designed for a magnitude sufficient to facilitate the residual carrier injection into the floating body region of body 105, yet small enough to guard against inter-latching with the MOSFET.

Although showing one memory cell 100,302 in FIG. 6, it may be understood that semiconductor device 300 may comprise a plurality of memory cells across the substrate. For example, the illustrated memory cell 100,302 may be configured in repeated mirrored relationship about various mirror axis, such as mirror axis 340.

Herein above, the body-injection MOSFET was described in integrated relationship for a thyristor-based memory, which resulted in the N-P-N-P-N-P structure 202, 105, 204, 314, 316, 318 respectively as illustrated in FIG. 6. In alternative embodiments, the body-injection enhanced MOSFETs may likewise be integrated into alternative circuits such as, e.g., buffer circuits, latching units, processors, routers, switchers, decoders, and others.

Figure 7:
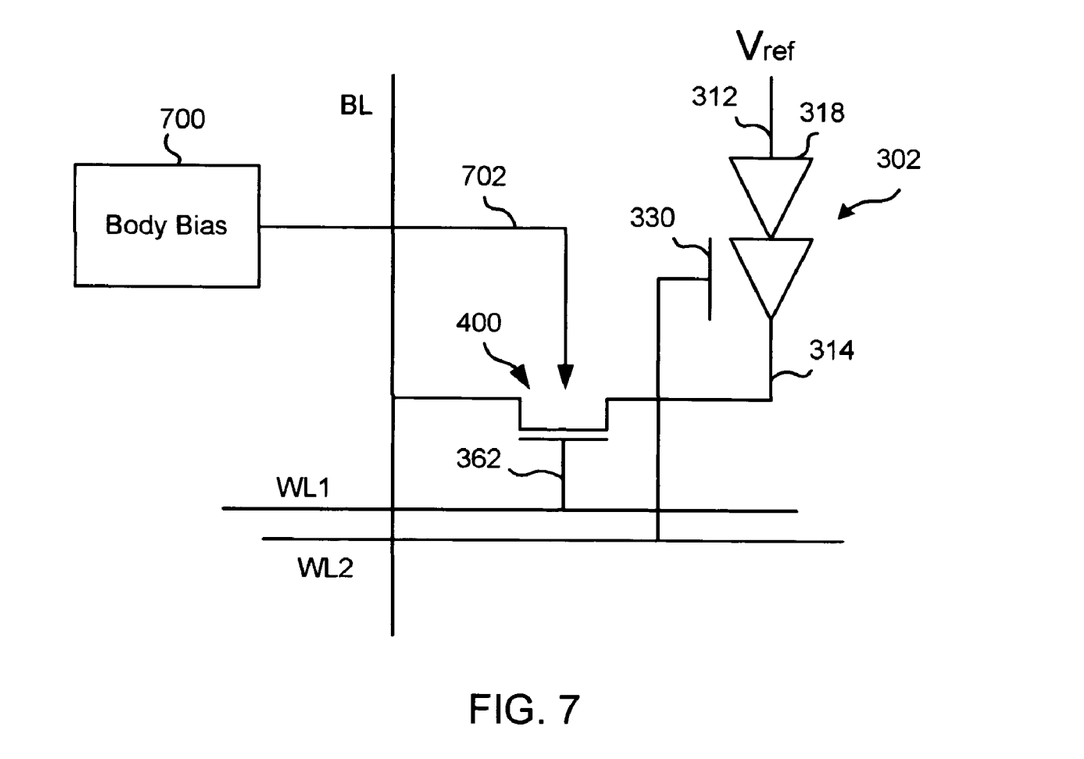
FIG. 7 is a schematic diagram of a memory cell in accordance with an embodiment of the present invention and showing a bias circuit to bias a floating body of the SIO MOSFET that is coupled in series with a thin-capacitively coupled thyristor.

In yet another embodiment, referencing FIGS. 6 and 7, bias circuit 700 may couple a voltage to the floating body region of a partially-depleted SOI MOSFET 400. The bias circuit 700, in particular embodiments, may be controlled by an external controller (not shown), that may adjust the voltage for biasing the floating body according to a pre-selected operation of the transistor. The selected operation may comprise, e.g., an operability for isolating high resistance for a low Ioff, transparent low resistance for high Ion, an intermediate resistance for given leakage and thyristor stability for memory retention, or simply for amplification. In further embodiments, the controller may cause the bias circuit 700 to bias the floating body portion of the MOSFET's body with a voltage level that may be based on a plurality of different input considerations—such as, e.g., the applied voltage levels of the first and/or second wordlines (WL1, WL2), the magnitude of the reference voltage (Vref), and/or the voltage level required for sensing data states on the bitline (BL).

To further assist an understanding of these particular embodiments, a proposed model for operation may again be described relative to a MOSFET's body region. Referencing FIGS. 6–7, the body region 105 may be influenced by the potentials of neighboring regions—including the voltage (Vgs) of gate electrode 112 and the voltage of the adjacent drain region 204. Electric fields may develop through the body between the gate electrode and the source region and may form an inversion channel in the surface region of the body. In forming the inversion layer, carriers may be pulled from deeper regions of the body and may thereby create a depleted zone that is stripped of carriers beneath the inversion channel layer. The depleted region may be characterized much like an intrinsic insulating region. A remaining portion of the body region, which has not been depleted, may thus be described as the floating body portion beneath the intrinsic or insulating barrier. This floating body may carry a voltage potential relatively isolated from the inversion channel. Further, one may theorize that perhaps the potential of the floating body might not begin to increase relative to the channel region until sufficient depletion for the insulating barrier therebetween has been established.

In a further embodiment, an electrical interconnect may be formed to contact the body region at a location outside the perimeter or outline of the gate electrode 112. In a particular application, this interconnect to the body region for biasing the floating body may be driven with a voltage related to that of the gate electrode. In another example, an electrical short may be provided between the gate electrode and the interconnect to the body, such that the gate and floating body regions may receive similar applied voltage levels. Accordingly, when the gate voltage is increased, the body voltage might also increase and a drain current may develop more rapidly than what might otherwise be available via the influence of the gate electrode alone.

In another exemplary application, further referencing FIG. 7, a controller with the bias circuit 700 may drive the floating body with a voltage appropriate for the selected state of the MOSFET. For example, assuming an NMOS device, the voltage for the floating body bias may be driven negative (e.g., −1V) for the off-state condition. This negative bias may act to limit leakage current (Ioff) of the transistor and to assist its isolation performance. Alternatively, when a high transparency or large drive current (Ion) may be desired, the voltage for the floating body may be driven positive (e.g., 1V).

In further possible aspects, the gate electrode may also comprise a silicide (not shown) over the patterned conductive material. The silicide may be formed of a refractory metal such as, e.g., titanium, cobalt or nickel.

While certain exemplary features of the embodiments of the invention have been illustrated and described herein, may modifications, substitutions, changes and equivalents may now occur to those skilled in the art. It is, therefore, to be understood that the appended claims are intended to cover all such embodiments and changes as fall within the spirit of the invention.

What is claimed is:

1. A silicon-on-insulator (SOI) device, comprising:
   a body region disposed between source and drain regions in a layer of silicon over an insulator,
   a gate disposed in insulated relationship to the body region and operable under bias to effect a conductivity within the body region;
   the body region comprising a channel portion proximate the gate and a floating body portion more distal the gate; and
   an extra dopant region against one of the source and the drain regions, the extra dopant region of a conductivity type opposite that of the one of the source and the drain regions;
   wherein the extra dopant region is separate and non-contiguous to the body region and separated therefrom by at least a portion of the one of the source and the drain regions; and
   the body region comprises a doping profile to assist the injection of carriers into the floating body portion of the body region.

2. The device of claim 1, further comprising:
   a memory cell;
   the source, body and drain regions in combination with the gate defining at least in part an access transistor by which to access the memory cell.

3. The device of claim 2, in which the one of the source and the drain regions comprises silicide at a surface of the layer of silicon for imparting a recombination rate sufficient to prevent interlatching of the access transistor during the injection of carriers into the floating body portion.

4. The device of claim 3, in which the body region, the one of the source and the drain regions and the extra dopant region comprise doping configurations to define a gain for an inherent bipolar device of a magnitude sufficient to assist the injection of carriers into the floating body portion and small enough to avoid interlatching.

5. The device of claim 2, in which the one of the source and the drain regions comprises:

a lower portion proximate the insulator of a first doping
concentration; and
an upper portion proximate a surface of the layer of
silicon of a second doping concentration;
wherein the first doping concentration is greater than the
second doping concentration by at least a factor of two.

6. The device of claim 2, in which the one of the source
and the drain regions comprises:
a lower portion proximate the insulator of a first doping
concentration; and
an upper portion proximate a surface of the layer of
silicon of a second doping concentration;
wherein the second doping concentration is sufficiently
light to impart a gain to an inherent bipolar device for
effecting carrier transport properties thereto as to define
at least in part and collectively by the body and the
drain regions of the access transistor and the extra
doped region;
the carrier transport gain as attributable to the inherent
bipolar device is further effected with magnitude to
assist the injection of carriers to the floating body
portion of the body region yet sufficiently small to
prevent inter-latching of the access transistor during
device operation.

7. A semiconductor-on-insulator (SOI) device, comprising:
a layer of semiconductor material over an insulator;
a body region disposed between source and drain regions
in the layer of semiconductor material;
a gate disposed in insulated relationship to the body
region and operable under bias to effect a conductivity
within the body region;
the body region comprising a channel portion proximate
the gate and a floating body portion more distal the
gate;
an extra dopant region against one of the source and the
drain regions and of a conductivity type opposite that of
the one of the source and the drain regions;
the one of the source and the drain regions disposed
between the extra dopant region and the body region
comprising a doping profile to assist injection of carriers into the floating body portion of the body region;
and
a thyristor for a memory cell defined at least in part within
the layer of semiconductor material;
wherein the source, the body and the drain regions in
combination with the gate define at least in part an
access transistor by which to access the thyristor; and
the extra dopant region defines part of the thyristor.

8. The device of claim 7, in which
the thyristor comprises anode/cathode emitter, first base,
second base, and cathode/anode emitter regions respectively in the layer of semiconductor material;
the anode/cathode emitter of the thyristor is in common
with the one of the source and the drain regions of the
access device;
the extra dopant region is in common with the first base
region of the thyristor; and
the device further comprises a capacitor electrode capacitively coupled through dielectric to the first base region
of the thyristor.

9. A semiconductor-on-insulator (SOI) device, comprising:
a layer of semiconductor material over an insulator for an
SOI structure;
a thyristor comprising anode-emitter, N-base, P-base, and
cathode-emitter regions in the layer of semiconductor
material;
a MOSFET transistor disposed electrically in series with
the thyristor, the MOSFET transistor comprising a
body region disposed between source and drain regions
in the semiconductor material; and
a gate electrode disposed in insulated relationship to the
body region and configured to receive a bias signal
operable to effect a conductivity within the body
region;
wherein the body region comprises a channel portion
proximate the gate electrode and a floating body portion distal the gate electrode; and
the cathode-emitter region for the thyristor is formed in
common with one of the source and the drain regions
to the MOSFET transistor, and comprises a doping
profile to assist injection of carriers into the floating
body portion of the body region.

10. The device of claim 9, in which the one of the source
and the drain regions further comprises a length between the
body region and an extra dopant region of the P-base region
to the thyristor that is operable collectively with the doping
profile thereof for the enabling of the carrier injection into
the floating body portion of the body region.

11. The device of claim 9, further comprising a capacitor
electrode capacitively coupled through dielectric to the
P-base region of the thyristor.

12. The device of claim 11, further comprising a bias
circuit configured to bias the floating body portion of the
body region of the MOSFET transistor.

13. The device of claim 9, in which the one of the source
and the drain regions in common with the cathode-emitter
region comprises:
a lower region proximate the insulator of a first doping
concentration; and
an upper region proximate a surface of the layer of
semiconductor material of a second doping concentration;
wherein the first doping concentration is greater than the
second doping concentration by at least a factor of two.

14. The device of claim 9, in which the one of the source
and the drain regions in common with the cathode-emitter
region comprises:
a lower region proximate the insulator of a first doping
concentration; and
an upper region proximate a surface of the layer of
semiconductor material of a second doping concentration;
wherein the second doping concentration is sufficiently
light to impart gain to a carrier transport property for an
inherent bipolar device defined at least in part and
collectively by the body and the drain regions of the
MOSFET transistor and the P-base region of the thyristor;
the carrier transport gain is attributable to the inherent
bipolar device further effected with magnitude sufficient to assist the carrier injection into the floating body
portion of the body region yet sufficiently small to
prevent inter-latching of the MOSFET during device
operation.

* * * * *